United States Patent [19]
White

[11] Patent Number: 4,657,283
[45] Date of Patent: Apr. 14, 1987

[54] CLAMP DEVICE

[75] Inventor: Allan E. White, Hightstown, N.J.

[73] Assignee: RCA Corporation, Princeton, N.J.

[21] Appl. No.: 853,429

[22] Filed: Apr. 18, 1986

[51] Int. Cl.⁴ .............................................. F16L 35/00
[52] U.S. Cl. ..................................... 285/18; 285/255;
 24/463; 24/115 R
[58] Field of Search ................ 24/463, 115 R, 115 M,
 24/136 L, 136 B, DIG. 28; 285/255, 258, 18, 96

[56] References Cited

U.S. PATENT DOCUMENTS

| 1,140,417 | 5/1915 | Svenson | 285/255 |
| 1,461,130 | 7/1923 | Loughead | 285/258 |
| 1,502,890 | 7/1924 | Veasey . | |
| 2,707,116 | 4/1955 | Hardwick | 285/258 |
| 3,364,533 | 1/1968 | Sibrava et al. . | |
| 3,532,365 | 10/1970 | Kronschnabel | 285/258 |
| 3,560,028 | 2/1971 | Manabu Ohba | 285/255 |
| 3,713,204 | 1/1973 | Arnold | 285/96 |
| 3,807,775 | 4/1974 | Addis et al. | 285/96 |
| 4,006,923 | 2/1977 | Wagner | 285/258 |

FOREIGN PATENT DOCUMENTS

| 279278 | 5/1965 | Australia | 285/258 |
| 556845 | 5/1958 | Canada | 285/258 |

OTHER PUBLICATIONS

"Pinch Valve for Dirty Liquids," News Release, Series N Microflex.

Primary Examiner—Victor N. Sakran
Attorney, Agent, or Firm—Joseph S. Tripoli; William Squire

[57] ABSTRACT

A wire gripping clamp has a rubber inner tube wedged to the ends of a rigid outer tube by a set of rings, one ring at each tube end. The space between the tubes is sealed by the rings and forms a chamber, which when pressurized, compresses the inner tube wedging the rings against it. The compressed inner tube grasps an insulated wire passing therethrough without damage to the wire. The rings serve as a clamp in response to tension on the inner tube and as a guide for the wire when the wire is displaced through the device for precluding damage to the inner tube and to the wire during that relative displacement.

7 Claims, 3 Drawing Figures

CLAMP DEVICE

This invention relates to clamping devices, and more particularly, to devices for releasably securing an insulated conductor without damaging the insulation.

In robotically wired assemblies, the ends of wires are normally pulled from spools and attached or soldered to different electronic components. Wires, during such robotic handling, tend to be wrapped around pullies, guides, and the like for restraining the wire and for defining the wire path as the wire is manipulated during the assembly process. Sometimes, however, the paths may drag the wires over components which may damage the components or the wire. In other cases, as in wire wrap operations, the wire at times has high tension which must be maintained to produce a good wire wrap joint. The present invention is directed to a need seen for a device for clamping and securing such wires during the wire wrap operation and for carrying wires in a robotic system without damage to the wire or neighboring components.

A pressurized fluid operated clamp device according to the present invention comprises a rigid outer tube having a longitudinal bore. An inner relatively pliable tube is within the outer tube bore. A pair of rings are included and dimensioned to fit within the outer tube bore at its ends. Each effective end of the outer tube bore and their mating rings are dimensioned and shaped for wedging an adjacent end of the inner tube therebetween for forming a sealed chamber between the inner tube, the outer tube, and the wedged inner tube ends. The outer tube includes inlet means for coupling the chamber to a pressurized fluid source for selectively compressing the inner tube in the chamber. The rings and inner tube thus form a single conduit terminated by said rings at the ends of the conduit. In this way a relatively soft material such as an insulated wire can be grasped by the compressed pliable inner tube when the chamber is pressurized without damaging the clamped wire insulation. The rings serve a dual purpose in guiding a length of material passing through the inner tube when the material enters and leaves the conduit formed by the inner tube and the rings, and for securing the inner tube to the outer tube. The rings preclude damage to the inner tube ends during displacement of the wire relative to the inner tube.

In the drawing

Figure 1:
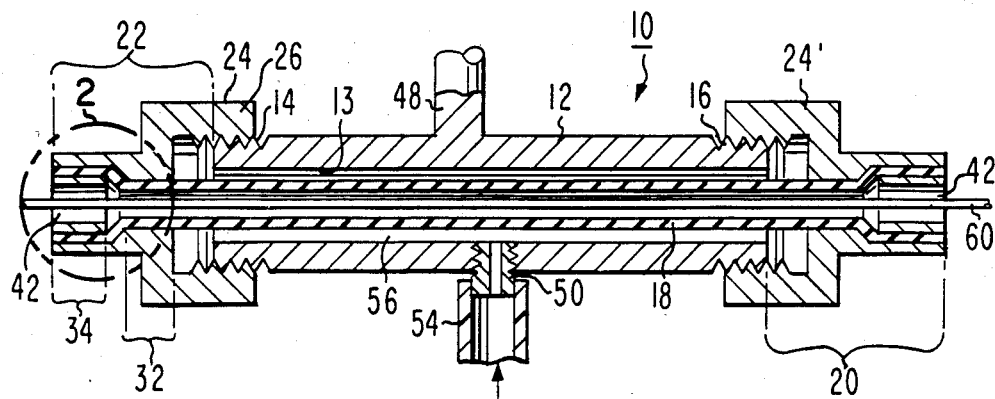
FIG. 1 is a sectional elevation view, partially schematic, of a clamp device in accordance with one embodiment of the present invention.

In FIG. 1, device 10 comprises an outer rigid, thermoplastic or metal, tube 12 threaded with annular external threads 14 and 16 at opposite ends thereof and having a longitudinal bore 13. A pliable, expandable rubber tube 18 has a smaller outer diameter than the inner diameter of the bore 13. Tube 18 passes through bore 13 so that one end of tube 18 projects beyond an end of tube 12 in region 20 and the other end of tube 18 projects beyond the other end of tube 12 in region 22. Two identical end caps 24 and 24' are respectively attached to threads 14 and 16.

Figure 2:
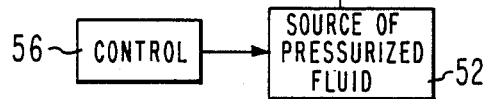
FIG. 2 is an enlarged end portion of the embodiment of FIG. 1 taken within the region 2 of FIG. 1.
Figure 2:
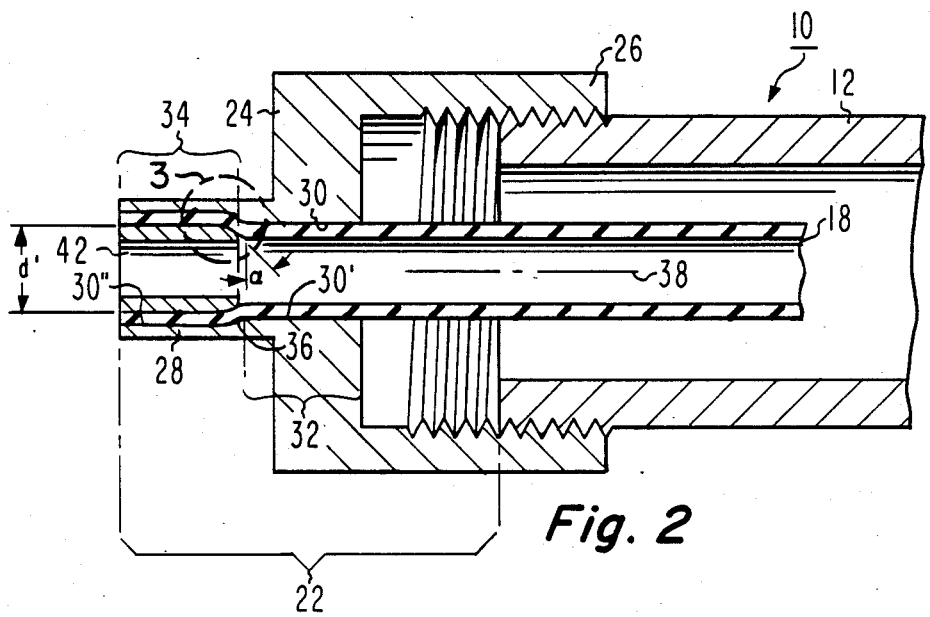
Figure 3:
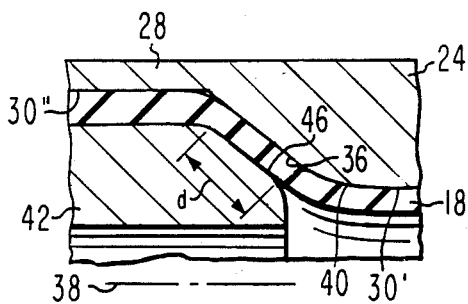
FIG. 3 is a more detailed sectional elevation view of the clamping portion in region 3 of FIG. 2.

In FIG. 2, representative cap 24 includes a threaded connector portion 26 and a clamping flange 28. Flange 28 is in the form of a circular annular ring. The inner surface 30 of cap 24 is formed into two coaxial stepped surfaces 30' and 30" of different diameters. Surface 30' has a smaller diameter than surface 30" and is coupled to the larger diameter surface 30", FIG. 3, by a tapered annular shoulder 36. Shoulder 36 tapers at an angle $\alpha$ less than 90° and preferably at approximately 45° with respect to the longitudinal axis 38 of tube 12. The surface 40 joining surface 30' with the shoulder 36 is rounded and provides a smooth contour. This is to avoid a sharp cutting edge at surface 40 in abutment with the pliable inner tube 18.

In FIG. 2, located within region 34 of the larger diameter surface 30" is a circular rigid ring 42, preferably metal or a hard thermoplastic. Ring 42 has a diameter sufficiently large to squeeze tube 18 against surface 30" in region 34 thereby clamping tube 18 to surface 30". The ring 42 may also be bonded to tube 18 and can axially move relative to the outer tube 12 along axis 38. Ring 42 has a tapered shoulder 46, FIG. 3, which is also at an angle of about $\alpha$. The shoulder 46 extends for a distance d which is sufficiently long to prevent cutting the tube 18 as it presses the tube 18 against shoulder 36. The shoulder 46 of ring 42 is chamfered relative to the inner and outer surfaces of ring 42 so as to provide a relatively wide region for abutting and clamping tube 18 against cap shoulder 36. Also the surface joining shoulder 40 of ring 42 with its outer diameter surface is rounded somewhat to similarly avoid providing a sharp cutting edge against tube 18. Diameter d' of ring 42, FIG. 2, is sufficiently larger than the diameter of surface 30' of cap 24 so as to form a wedging action of shoulder 40 of the ring against shoulder 36 of the cap 24 when tube 18 is under tension. Both rings 42 are pulled inwardly toward tube 12 along axis 38 by the tension on tube 18 and the friction between tube 18 and the rings.

In FIG. 1, a post 48 is secured to tube 12 for attaching the tube 12 to the hand of a robot (not shown) or other manipulator. A fitting 50 is secured to tube 12 and coupled to a source of pressurized fluid 52, for example, pressurized air, via coupling hose 54. Control 56 switches the source of pressurized fluid on and off for selectively pressurizing chamber 56 defined by the space between inner tube 18 and the outer tube 12 and the clamped regions of tube 18 at its opposite ends.

In operation, a wire 60 FIG. 1, is passed through the core of tube 18 and rings 42. Rings 42, one at each end of tube 12 for securing tube 18 in identical fashion to the respective caps 24 and 24', are polished smooth steel having rounded corners for guiding and precluding damage to an insulated wire 60 which passes through rings 42 and tube 18. One end of wire 60 is supplied through a spool (not shown) and the other end is fed to a robotic assembly system (not shown) for attaching that end to an electronic assembly, by way of example, by wire wrapping apparatus. While that end is attached to the electronic assembly the clamp device 10 grasps the wire 60 for precluding relative displacement of the wire to the wire wrap tool. Then, a robot can displace device 10 via post 48 to a different location for further processing wire 60. Later, pressurized fluid, for example, air, from source 52 is removed from the chamber 56 and the wire is free to slide through the tube 18 and over the rings 42 as the wire is processed. When it is desired to fix the wire 60 in place at a given location for processing, control 56 couples the source of pressurized fluid to device 10, pressurizing chamber 56. The pressure in chamber 56 compresses the flexible inner tube 18 and jamming it against insulated wire 60 without damage to the wire insulation. This firmly grips the wire 60 and prevents it from sliding relative to the device 12 while wire 60 is being processed, for example, by wire wrap tools (not shown). Also, the pressure applied may be at a value sufficient for the inner tube to frictionally hold the wire in place as a means for providing tension adjustment on the wire. That is, the wire may be allowed to slip when a certain tensile load is reached. Also the pressure can be set to provide instant friction load on a wire slipping through the tube 18. Such a pressure is set by control 56.

The engagement of the rubber tube 18 with the relatively soft insulation of a typical electrical wire 60 precludes damaging the wire as might occur if the contact were made with a more rigid material, such as a metal element and the like. The pliable tube contacts the wire 60 over a relatively long length of the wire, firmly, but gently grasping the wire. While so clamped, the device 10 may be held in place or may be moved about in accordance with a given manufacturing sequence. At the end of a given manufacturing cycle, the pressurized fluid is released from chamber 56, tube 18 returns through its normal latent stresses to the release state of FIG. 1 and the wire 60 is once again free to pass through the device 10.

An important aspect of the present invention is the fact that as the tube 18 is compressed when under pressure, that pressure and compression places the tube 18 under tensile load expanding the tube. That expansion applies a pulling force on the ends of the tube at rings 42. Because the tube is frictionally engaged with or bonded to each of the rings 42 which are movably secured relative to the caps 24 and 24', the frictional force or bond of the rubber tube on the rings tends to pull the rings centrally toward each other. That pulling action tends to further wedge the rings against the caps 24 and 24', wedging the shoulders 40 of the rings toward the shoulders 36 of the caps. Thus, the higher the pressure on the inner tube as it is compressed, the greater the tube is secured at its ends. This is important to preclude sliding or otherwise release of the tube at its ends during the compression cycle as might occur if the rings were rigidly secured to the caps. If the tube were to displace relative to the caps and rings during such a compression cycle, then the tube would tend to release at its ends and the compression advantage may be lost. Thus, the wedging action and clamping of the rubber tube ends when compressed is enhanced when the clamping action is needed most at the time the inner tube is under tension.

In the alternative, end caps 24 and 24' may be omitted. The stepped inner surfaces 30' and 30" and shoulder 36 of the caps may be formed in the inner surface of outer tube 12.

In a second alternative, rings 42 may be secured to the outer tube 12 or the end caps 24 and 24' by bonding or by threads. In this case, the rings need be securely clamped against the inner tube 18 at all times.

What is claimed is:

1. A clamp device comprising:
   an outer tubular member having a bore lying on a longitudinal axis and first and second oppositely disposed ends;
   an inner tubular member within the bore of and pliable relative to the outer member, the inner member having portions adjacent the ends of said outer tubular member at first and second regions;
   said outer tubular member having an inner bore and a pair of outer circular cylindrical bores aligned on said axis, one outer bore at each end of the outer tubular member at said first and second regions, the inner bore having a smaller diameter than the outer bores and positioned next to and between the outer bores, the transition region between said outer and inner bores being inclined relative to said axis to form a frustro-conical surface of a given extent parallel to said axis, each of said outer bores extending parallel to said axis a distance substantially greater than said given extent; said given extent having a magnitude just sufficiently great to provide said frustro-conical surface;
   a pair of clamping rings, a different one in each of said outer bores, each ring having a circular cylindrical portion extending along said axis and dimensioned to closely fit within the bore of the inner tubular member at a corresponding one of said outer bores, an end of each of said rings having a frustro-conical surface corresponding to and adapted to face a different transition region to compressively clamp that inner tubular member substantially in that transition region in response to a tensile force induced in the inner member; and
   inlet means coupled to the outer member adapted to couple a source of pressurized fluid to the chamber defined by said inner and outer tubular members between said clamped end regions to induce said tensile force in said inner member.

2. The clamp of claim 1 further including means secured to the outer member adapted to be attached to a support.

3. The clamp of claim 1 wherein said outer tubular member and ring members are metal and said inner tubular member is rubber, said rings being sufficiently durable and smooth to serve as a guide for a wire moving through the core of said inner tubular member.

4. The clamp of claim 1 wherein said flange members are threaded to the outer tubular member.

5. The clamp of claim 1 wherein said flange members each have a shoulder coupling the inner and outer bores thereof, said shoulder tapering at an angle less than 90° relative to a direction parallel to the longitudinal axes of said tubular members, said rings each having a chamfered edge facing said shoulder for clamping the inner tubular member to said shoulder.

6. The clamp of claim 1 wherein each said rings has an outer diameter greater than the diameter of the corresponding flange member inner bore and smaller than the diameter of that corresponding flange member outer bore.

7. The clamp of claim 1 wherein said flange members each have an annular chamfered shoulder coupling the inner and outer bores thereof, said rings each having an annular chamfered shoulder facing and juxtaposed with the shoulder of the corresponding flange member for clamping and squeezing the inner tubular member between said shoulders in response to tension on said inner tubular member.

* * * * *